United States Patent
Scott et al.

(10) Patent No.: US 12,160,210 B2
(45) Date of Patent: Dec. 3, 2024

(54) DRIVING AMPLIFIER STAGE WITH LOW OUTPUT IMPEDANCE

(71) Applicant: Qorvo US, Inc., Greensboro, NC (US)

(72) Inventors: Baker Scott, San Jose, CA (US);
George Maxim, Saratoga, CA (US);
Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 489 days.

(21) Appl. No.: 17/588,867

(22) Filed: Jan. 31, 2022

(65) Prior Publication Data
US 2023/0246611 A1    Aug. 3, 2023

(51) Int. Cl.
| | | |
|---|---|---|
| H03F 1/30 | (2006.01) | |
| H03F 1/02 | (2006.01) | |
| H03F 1/56 | (2006.01) | |
| H03F 3/195 | (2006.01) | |
| H03F 3/24 | (2006.01) | |
| H03F 3/45 | (2006.01) | |

(52) U.S. Cl.
CPC .......... *H03F 3/245* (2013.01); *H03F 1/0222* (2013.01); *H03F 1/56* (2013.01); *H03F 3/195* (2013.01); *H03F 3/45179* (2013.01); *H03F 2200/451* (2013.01)

(58) Field of Classification Search
CPC ................ H03F 1/30; H03F 1/02; H03F 1/07
USPC ...................... 330/297, 124 R, 295
See application file for complete search history.

(56) References Cited

U.S. PATENT DOCUMENTS

| | | | | |
|---|---|---|---|---|
| 5,200,708 A | * | 4/1993 | Morris, Jr. ................ | H03F 3/68 |
| | | | | 381/109 |
| 6,285,251 B1 | | 9/2001 | Dent et al. | |
| 6,825,719 B1 | * | 11/2004 | Barak ................... | H03F 1/0294 |
| | | | | 330/129 |
| 8,130,043 B2 | * | 3/2012 | Arell ..................... | H03F 1/0277 |
| | | | | 330/124 R |

(Continued)

FOREIGN PATENT DOCUMENTS

WO        2020006990 A1    1/2020

OTHER PUBLICATIONS

Mondal, S. et al., "An ECG Chopper Amplifier Achieving 0.92 NEF and 0.85 PEF with AC-coupled Inverter-Stacking for Noise Efficiency Enhancement," 2017 IEEE International Symposium on Circuits and Systems (ISCAS), May 28-31, 2017, Baltimore, MD, USA, IEEE, 4 pages.

(Continued)

*Primary Examiner* — Henry Choe
(74) *Attorney, Agent, or Firm* — Withrow & Terranova, P.L.L.C.

(57) ABSTRACT

A driving amplifier with low output impedance is disclosed. In one aspect, a driving amplifier stage that does not need an inter-stage impedance matching network between the driving amplifier stage and an output amplifier stage in a transmission chain may be achieved by providing stacking transconductance devices within the driving amplifier stage and reusing a supply current to provide an intermediate signal with high current but moderated voltage swing to drive the output amplifier stage. In specifically contemplated aspects, the stacked transconductance devices may be complementary metal oxide semiconductor (CMOS) field effect transistors (FETs).

20 Claims, 10 Drawing Sheets

(56) References Cited

U.S. PATENT DOCUMENTS

| | | | |
|---|---|---|---|
| 8,824,978 B2 * | 9/2014 | Briffa | H03F 3/195 |
| | | | 455/127.1 |
| 9,020,453 B2 * | 4/2015 | Briffa | H04B 1/0483 |
| | | | 455/127.1 |
| 2011/0109393 A1 | 5/2011 | Adamski et al. | |
| 2011/0199156 A1 * | 8/2011 | Hayakawa | H03F 1/0288 |
| | | | 330/124 R |

OTHER PUBLICATIONS

Extended European Search Report for European Patent Application No. 23153991.7, mailed Jul. 5, 2023, 12 pages.

\* cited by examiner

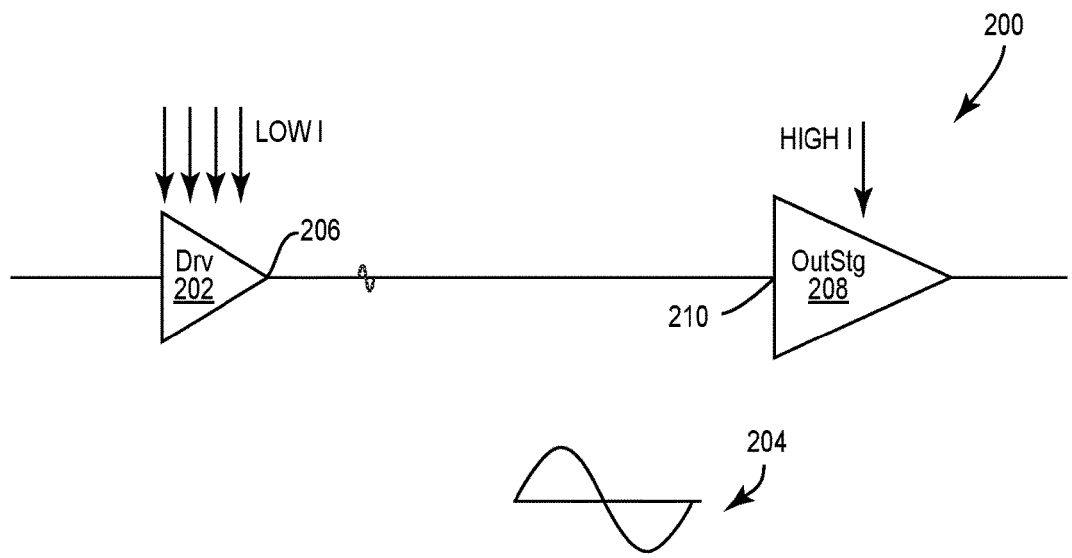
FIG. 2
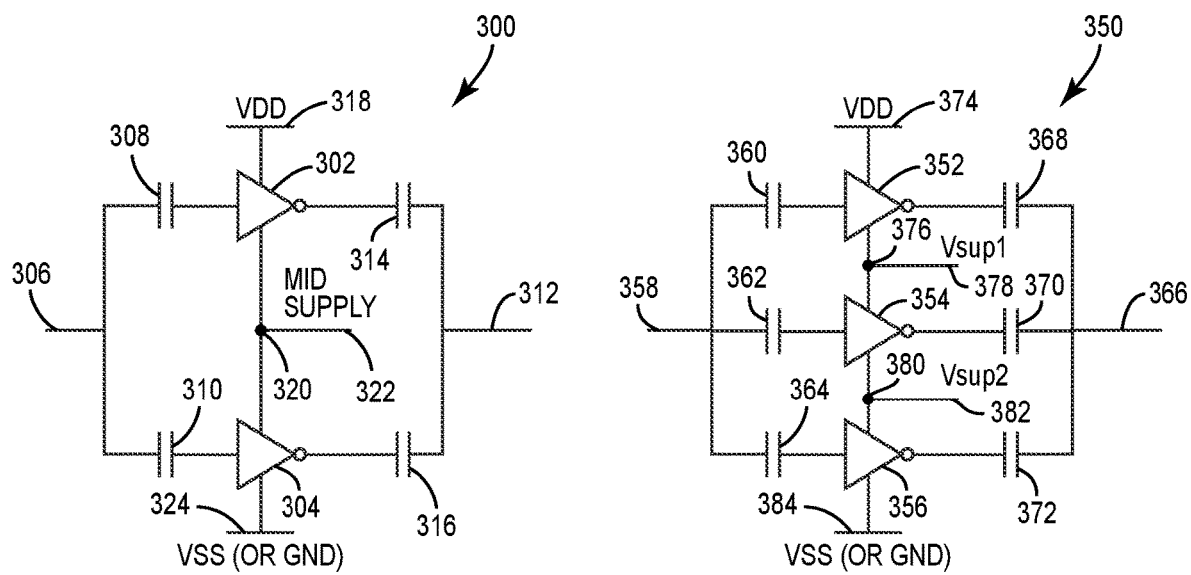
FIG. 3A
FIG. 3B

DRIVING AMPLIFIER STAGE WITH LOW OUTPUT IMPEDANCE

BACKGROUND

I. Field of the Disclosure

The technology of the disclosure relates generally to a driving circuit for a power amplifier.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. The advent of the Fifth Generation-New Radio (5G-NR) cellular standard has imposed new challenges for transmitters operating in mobile communication devices. Specifically, the elevated frequencies at which 5G-NR operates impose challenging requirements for signal transmission and more specifically for the power amplifiers used to boost transmitted signals to desired power levels at the appropriate frequencies. Accordingly, there is room for improvements for power amplifiers in transmitters.

SUMMARY

Aspects disclosed in the detailed description include a driving amplifier stage with low output impedance. In particular, exemplary aspects of the present disclosure contemplate a driving amplifier stage that does not need an inter-stage impedance matching network between the driving amplifier stage and an output amplifier stage in a transmission chain. The low output impedance of the driving amplifier stage may be achieved by providing stacking transconductance devices within the driving amplifier stage and reusing a supply current to provide an intermediate signal with high current but moderated voltage swing to drive the output amplifier stage. In specifically contemplated aspects, the stacked transconductance devices may be complementary metal oxide semiconductor (CMOS) field effect transistors (FETs). By providing a high current intermediate signal with moderate voltage swing, the need for an inter-stage matching circuit may be reduced or eliminated.

In this regard in one aspect, a driving amplifier stage is disclosed. The driving amplifier stage comprises an input. The driving amplifier stage also comprises an output. The driving amplifier stage also comprises an amplifier stack coupled to the input. The amplifier stack comprises a first amplifier coupled to the input and the output. The amplifier stack also comprises a second amplifier coupled to the input and coupled to the output such that a summed output signal is available at the output. The amplifier stack also comprises a voltage supply input. The amplifier stack also comprises a mid-level voltage supply input node between the first amplifier and the second amplifier. The mid-level voltage supply input node is configured to be held at a fraction of a voltage supply level to limit voltage swing across the first amplifier.

In another aspect, a driving amplifier stage is disclosed. The driving amplifier stage comprises an input configured to receive a radio frequency (RF) input. The driving amplifier stage also comprises an amplifier stack. The amplifier stack comprises a first amplifier comprising a CMOS arrangement of a first n-type FET (NFET) and a first p-type FET (PFET). The amplifier stack also comprises a mid-level voltage supply input node coupled to the first amplifier. The amplifier stack also comprises a second amplifier comprising a CMOS arrangement of a second NFET and a second PFET. The second PFET is coupled to the mid-level voltage supply input node. The first amplifier and the second amplifier share a current. The amplifier stack also comprises an output configured to provide a summed output signal from the first amplifier and the second amplifier.

In another aspect, an amplifier system is disclosed. The amplifier system comprises a driving amplifier stage. The driving amplifier stage comprises an input configured to receive an RF input. The driving amplifier stage also comprises an amplifier stack. The amplifier stack comprises a first amplifier comprising a CMOS arrangement of a first NFET and a first PFET. The amplifier stack also comprises a mid-level voltage supply input node coupled to the first amplifier. The amplifier stack also comprises a second amplifier comprising a CMOS arrangement of a second NFET and a second PFET. The second PFET is coupled to the mid-level voltage supply input node. The first amplifier and the second amplifier share a current. The amplifier system also comprises an output power amplifier stage coupled to the output.

BRIEF DESCRIPTION OF THE DRAWINGS

FIG. 2 is a block diagram of an exemplary transmission chain having a driving amplifier stage according to aspects of the present disclosure such that no inter-stage impedance network is required therebetween;

FIG. 3A is a circuit diagram of an exemplary set of two stacked amplifiers to provide stacked transconductance devices that may be used to form the driving amplifier stage of FIG. 2;

FIG. 3B is a circuit diagram of an exemplary set of three stacked amplifiers to provide stacked transconductance devices that may be used to form the driving amplifier stage of FIG. 2;

DETAILED DESCRIPTION

Figure 1:
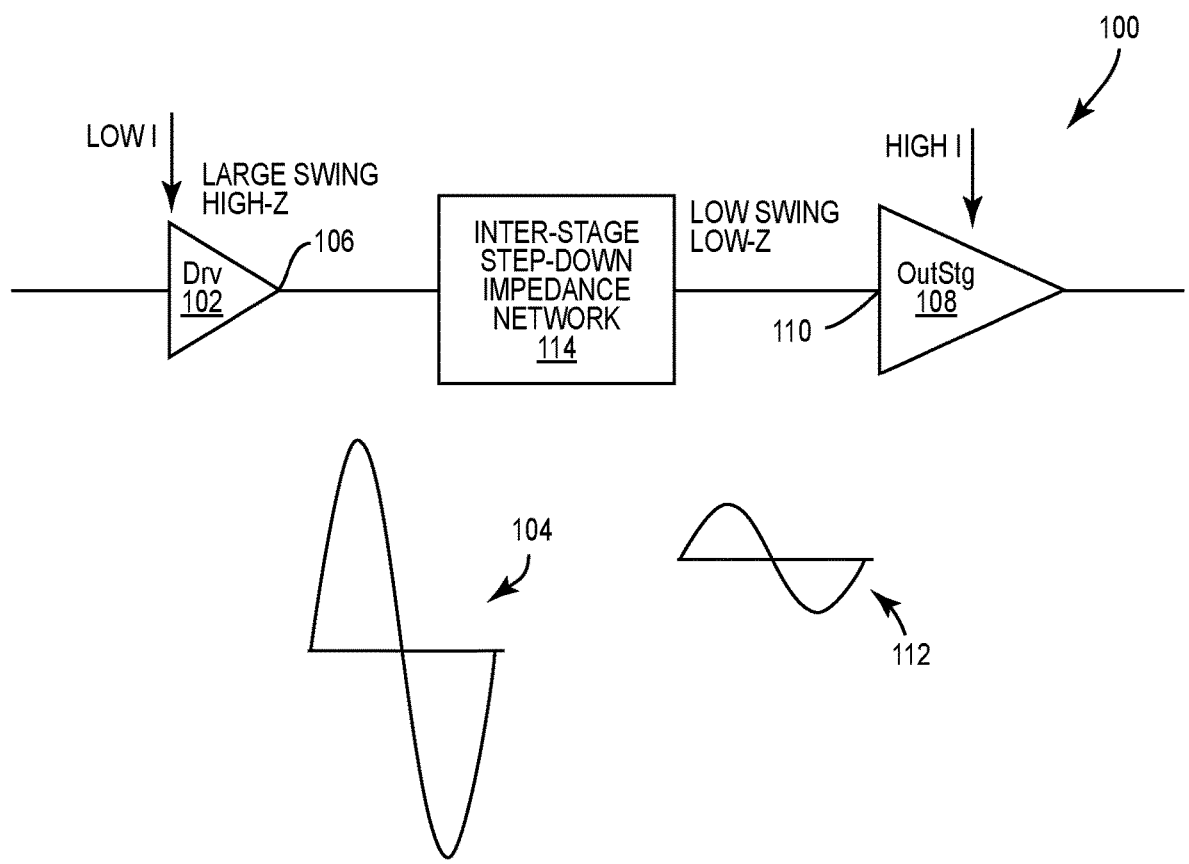
FIG. 1 is a block diagram of a conventional transmission chain having a driving amplifier stage and an output amplifier stage with an impedance network therebetween.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a driving amplifier stage with low output impedance. In particular, exemplary aspects of the present disclosure contemplate a driving amplifier stage that does not need an inter-stage impedance matching network between the driving amplifier stage and an output amplifier stage in a transmission chain. The low output impedance of the driving amplifier stage may be achieved by providing stacking transconductance devices within the driving amplifier stage and reusing a supply current to provide an intermediate signal with high current but moderated voltage swing to drive the output amplifier stage. In specifically contemplated aspects, the stacked transconductance devices may be complementary metal oxide semiconductor (CMOS) field effect transistors (FETs). By providing a high current intermediate signal with moderate voltage swing, the need for an inter-stage matching circuit may be reduced or eliminated.

Before addressing exemplary aspects of the present disclosure a brief overview of a conventional power amplifier chain having a driving amplifier stage and an output amplifier stage with an inter-stage impedance circuit positioned therebetween is provided with reference to FIG. 1 to highlight the advantages of exemplary aspects of the present disclosure. A discussion of exemplary aspects begins below with reference to FIG. 2.

In this regard, FIG. 1 is a block diagram of a transmission chain 100 of a mobile computing device (not shown). A baseband signal containing information to be transmitted may be generated by a baseband processor (not shown) and converted to a frequency of interest (e.g., frequencies complying with the 5G-NR standard or other radio frequency (RF). This RF signal is provided to a driving amplifier stage 102. The driving amplifier stage 102 may be a FET, a bipolar junction transistor (BJT), or a heterojunction bipolar transistor (HBT). The driving amplifier stage 102 receives a low current (Low I) from a voltage source (not shown) and outputs a large swing voltage signal 104 at output 106 as a function of the relatively high impedance of the driving amplifier stage 102. An output amplifier stage 108 is used to boost the signal to levels suitable for transmission and generally has a low impedance input 110, but takes a relatively high current (High I) from a voltage source. The low impedance input 110 is configured to receive a relatively low swing voltage signal 112. To transition the large swing voltage signal 104 to the low swing voltage signal 112, an inter-stage step-down impedance network or circuit 114 is used to transform the signal as desired.

The presence of the inter-stage step-down impedance circuit 114 imposes a physical cost in terms of space and bill of materials. For example, at the frequencies of interest, such a circuit is likely a higher order circuit with a relatively large inductor. Alternatively, such inter-stage step-down impedance circuit 114 may impose severe bandwidth limitations, which are not desirable. Additionally, the presence of the inter-stage step-down impedance circuit 114 may consume power and attenuate the signal to be transmitted by some amount, requiring extra amplification by the output amplifier stage 108.

Exemplary aspects of the present disclosure provide an improved driving amplifier stage that allows the simplification or elimination of the inter-stage step-down impedance circuit 114. Specifically, exemplary aspects of the present disclosure provide a driving amplifier stage that has a reduced output impedance. The reduced output impedance is achieved by providing stacked transconductance devices. In specific aspects, the stacked transconductance devices use a stacked complementary amplifier configuration that provides a large stage gain by using a current reuse configuration. Elimination of the inter-stage step-down impedance circuit 114 further allows for the signal path to the output amplifier stage to be wide bandwidth, which is important at the frequencies of interest. It should be appreciated that while elimination of the inter-stage step-down impedance circuit 114 is desired, some alternating current (AC) coupling and/or optional high-pass filters may remain in place to assist in conditioning the signal for use by the output amplifier stage.

At its simplest, an exemplary aspect of the present disclosure is illustrated by transmission chain 200 in FIG. 2. As before, the transmission chain 200 may include a baseband processor (not shown) and an intermediate frequency processor (also not shown) that generates an RF signal that is provided to a driving amplifier stage 202. The driving amplifier stage 202 receives a low current (Low I) from a voltage source (not shown) and outputs a low swing voltage signal 204 at output 206. An output amplifier stage 208 is used to boost the signal to levels suitable for transmission and generally has a low impedance input 210, but takes a relatively high current (High I) from a voltage source. The low impedance input 210 is configured to receive the relatively low swing voltage signal 204. By generating the relatively low swing voltage signal 204, there is reduced need for any inter-stage matching. In an exemplary aspect, the inter-stage matching circuitry is eliminated. In an alternate exemplary aspect, some AC coupling and optional high-pass filtering may be kept as some form of inter-stage network. However, such minimal circuitry should not hamper the signal path bandwidth.

The driving amplifier stage 202 may be formed from stacked amplifiers that use an AC input split and output combining. Two examples of driving amplifier stages are provided in FIGS. 3A and 3B. Specifically, FIG. 3A illustrates a driving amplifier stage 300 having two stacked amplifiers 302, 304. The two stacked amplifiers 302, 304 may be coupled to an input 306 through capacitors 308, 310 and coupled to an output 312 (analogous to output 206) through capacitors 314, 316. The amplifier 302 may be coupled to a voltage source 318 (VDD) and may be an inverting or non-inverting amplifier. The two stacked amplifiers 302, 304 are joined at a node 320, which may also be coupled to a voltage source 322 (mid-level voltage supply), which may be VDD/2 or the like as better explained below. Accordingly, the node 320 may be referred to as a mid-level voltage supply input node which is configured to be held at a fraction of a voltage supply level to limit voltage swing across the amplifier 302. The amplifier 304 may be coupled to the voltage source 322 and to a reference voltage 324, which may be VSS or a ground.

FIG. 3B illustrates a driving amplifier stage 350 having three stacked amplifiers 352, 354, 356. The three stacked amplifiers 352, 354, 356 may be coupled to an input 358 through capacitors 360, 362, 364 and coupled to an output 366 (analogous to output 206) through capacitors 368, 370, 372. The amplifier 352 may be coupled to a voltage source 374 (VDD) and may be an inverting or non-inverting amplifier. The amplifiers 352, 354 are joined at a node 376, which may also be coupled to a voltage source 378 (Vsup1), which may be 2VDD/3 or the like as better explained below. The amplifiers 354, 356 are joined at a node 380, which may also be coupled to a voltage source 382 (Vsup2), which may be VDD/3 or the like as better explained below. The amplifier 356 may be coupled to the voltage source 382 and to a reference voltage 384, which may be VSS or a ground.

Figure 4:
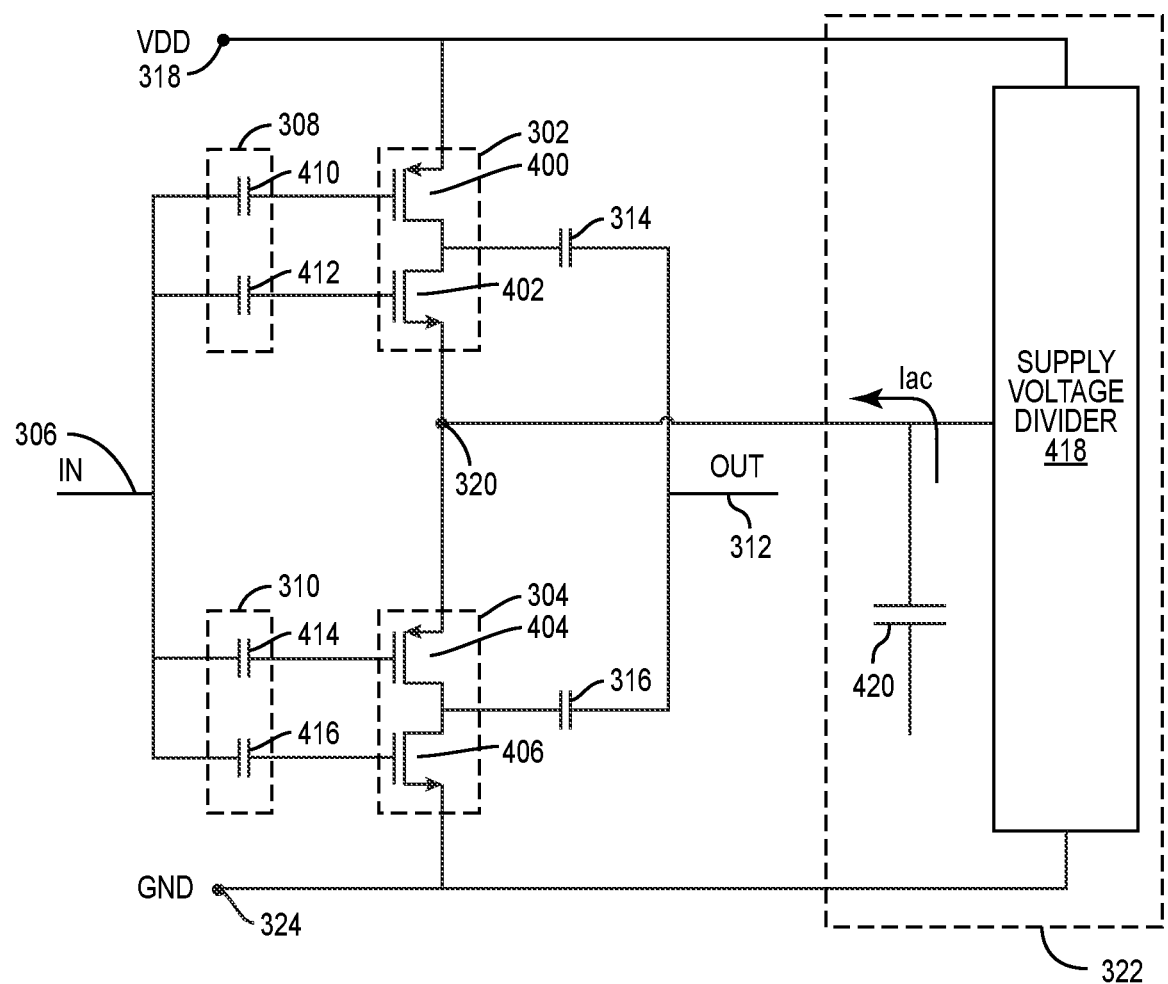
FIG. 4 is a circuit diagram of the two stacked amplifiers of FIG. 3A with additional detail about the supply voltage.

FIG. 4 provides more details about the stacked amplifiers of FIG. 3A as well as one possible way that mid-level voltage supply may be provided. In particular, the power amplifiers 302 and 304 may not only be stacked relative to one another, but also contain stacked complementary FETs therewithin. Thus, the power amplifier 302 may include a p-type FET (PFET) 400 and an n-type FET (NFET) 402, and the power amplifier 304 may include a PFET 404 and an NFET 406. The capacitor 308 may include parallel capacitors 410, 412, and the capacitor 310 may include parallel capacitors 414, 416. To generate VDD/2 at the node 320, the original voltage source 318 may be supplied to a supply voltage divider 418, which charges a capacitor 420 that may act as a filtering capacitance to provide an AC/RF supply current Iac to the node 320. By holding the node 320 at VDD/2 (i.e., half or a fraction of the voltage source 318), the rail-to-rail voltage swing of the amplifier 302 or 304 is limited to VDD/2 while the current is shared across the amplifiers 302, 304 and doubled through transconductance stacking.

The use of stacked FETs in this fashion provides a large transconductance gain. It should be appreciated that CMOS processes (e.g., silicon on insulator (SOI) CMOS processes) will use strained PFET's (e.g., Germanium (Ge) strained) so that the PFETs 400, 404 have comparable transconductance and transition frequencies to the NFETs 402, 406. The comparable FETs 400, 402, 404, 406 allows the FETs 400, 402, 404, 406 to be stacked without bringing a capacitance drawback, and the same transconductance gain per capacitance is achieved by the PFETs 400, 404 and the NFETs 402, 406.

The net result of the transconductance stacking of the FETs 400, 402, 404, 406 is a four-fold reduction in impedance level at the output 312. It should be appreciated that a larger number of stacked CMOS stages can be placed on top of each other. Thus, for example, if the same stacking is applied to the driving amplifier stage 350 of FIG. 3B, with Vsup1 being 2VDD/3 and Vsup2 being VDD/3, a nine-fold impedance reduction may be achieved. Accordingly, given a specific input impedance for an output amplifier stage 208, an appropriate stack size may be chosen to have a comparable impedance level, and thus avoid the need of a band limiting inter-stage step-down impedance circuit 114. As an additional benefit for many CMOS processes, the battery supply is set for 3.4 volts (V), and thus, it may be possible to bias the driving amplifier stage 350 directly from the battery since the FETs are designed for 1.2 V supply. That is, each of the paired stacks has a swing of one-third of the battery level, which is less than the designed 1.2 V.

Figure 5:
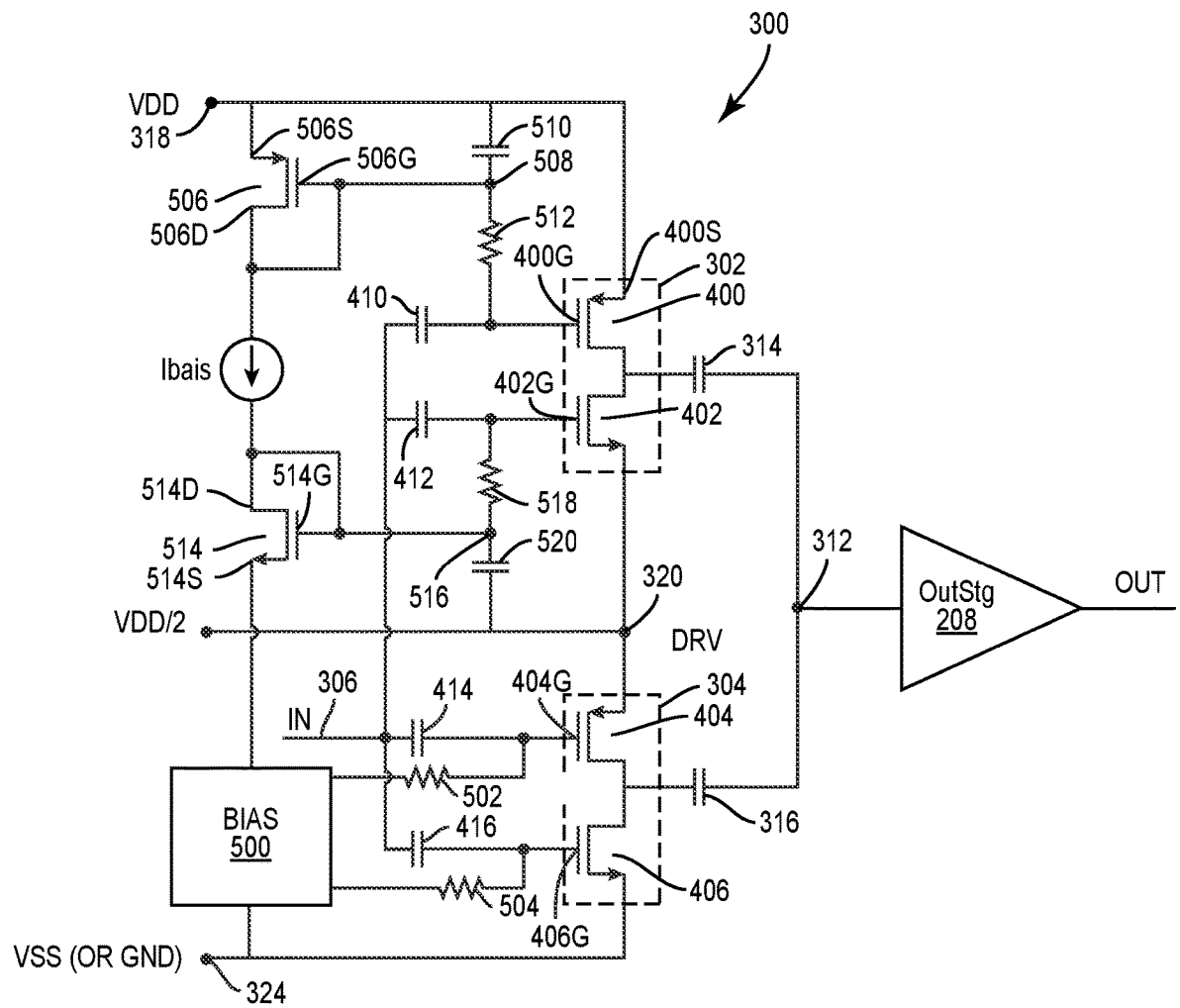
FIG. 5 is a circuit diagram of the two stacked amplifiers of FIG. 3A with additional detail about possible biasing for the stacked transconductance devices.

While the above discussion has had a terse exploration of the circuits before the power amplifiers 302, 304, it should be appreciated that the power amplifiers 302, 304 may require biasing. Accordingly, FIG. 5 provides additional details about exemplary biasing circuitry. In particular, a signal arrives at the input 306 and passes through the capacitors 410, 412, 414, 416 to the FETs 400, 402, 404, 406 and particularly to respective gates of the FETs 400, 402, 404, 406, The gate 404G is also connected to a bias circuit 500 through a resistor 502. Likewise, the gate 406G is also connected to the bias circuit 500 through a resistor 504. The bias circuit 500 may be coupled to the ground 324.

The voltage supply 318 may be coupled to a source 400S. Additionally, the voltage supply 318 may be coupled to a source 506S of a PFET 506. A gate 506G may be coupled to a node 508. The node 508 is coupled to the voltage source 118 through a capacitor 510. The node 508 is coupled to a gate 400G through a resistor 512. A drain 506D may be coupled to a drain 514D of a transistor 514. A source 514S may be coupled to the bias circuit 500. A gate 514G may be coupled to a node 516. The node 516 is coupled to a gate 402G through a resistor 518. The node 516 may be coupled to the node 320 through a capacitor 520. It should be appreciated that other bias circuits and bias networks may be used.

Figure 6:
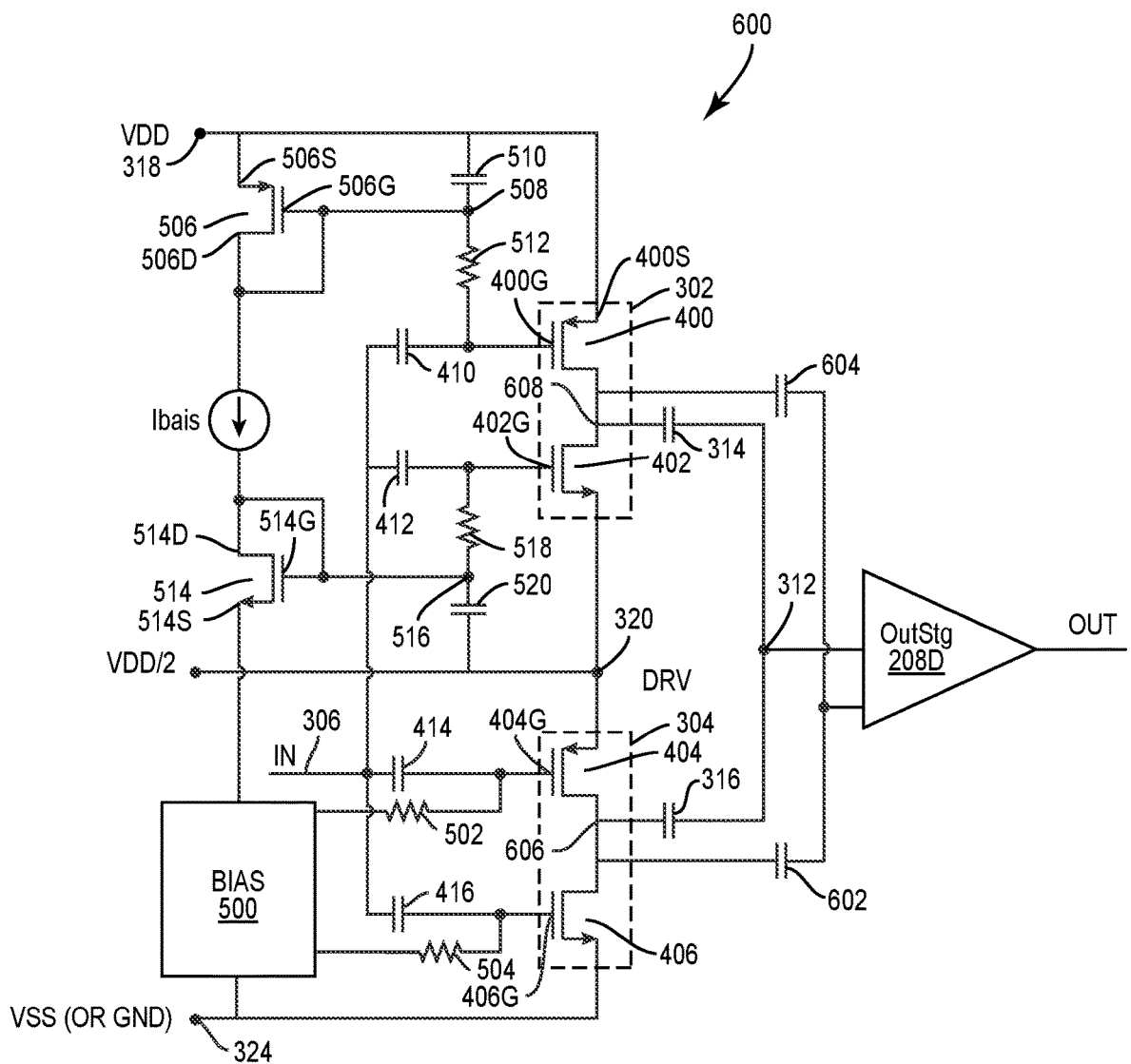
FIG. 6 is a circuit diagram of two stacked amplifiers that provide a differential output to an output amplifier stage.

As illustrated, the output amplifier stage 208 of FIG. 5 is single-ended and unipolar. The present disclosure is not so limited, and as illustrated in FIG. 6, a differential input output amplifier stage 208D may be used with a driving amplifier stage 600. The driving amplifier stage 600 is substantially similar to the driving amplifier stage 300 illustrated in FIG. 5. Two additional capacitors 602, 604 are added, coupling the output amplifier stage 208D to the common drain nodes 606, 608, respectively.

Figure 7:
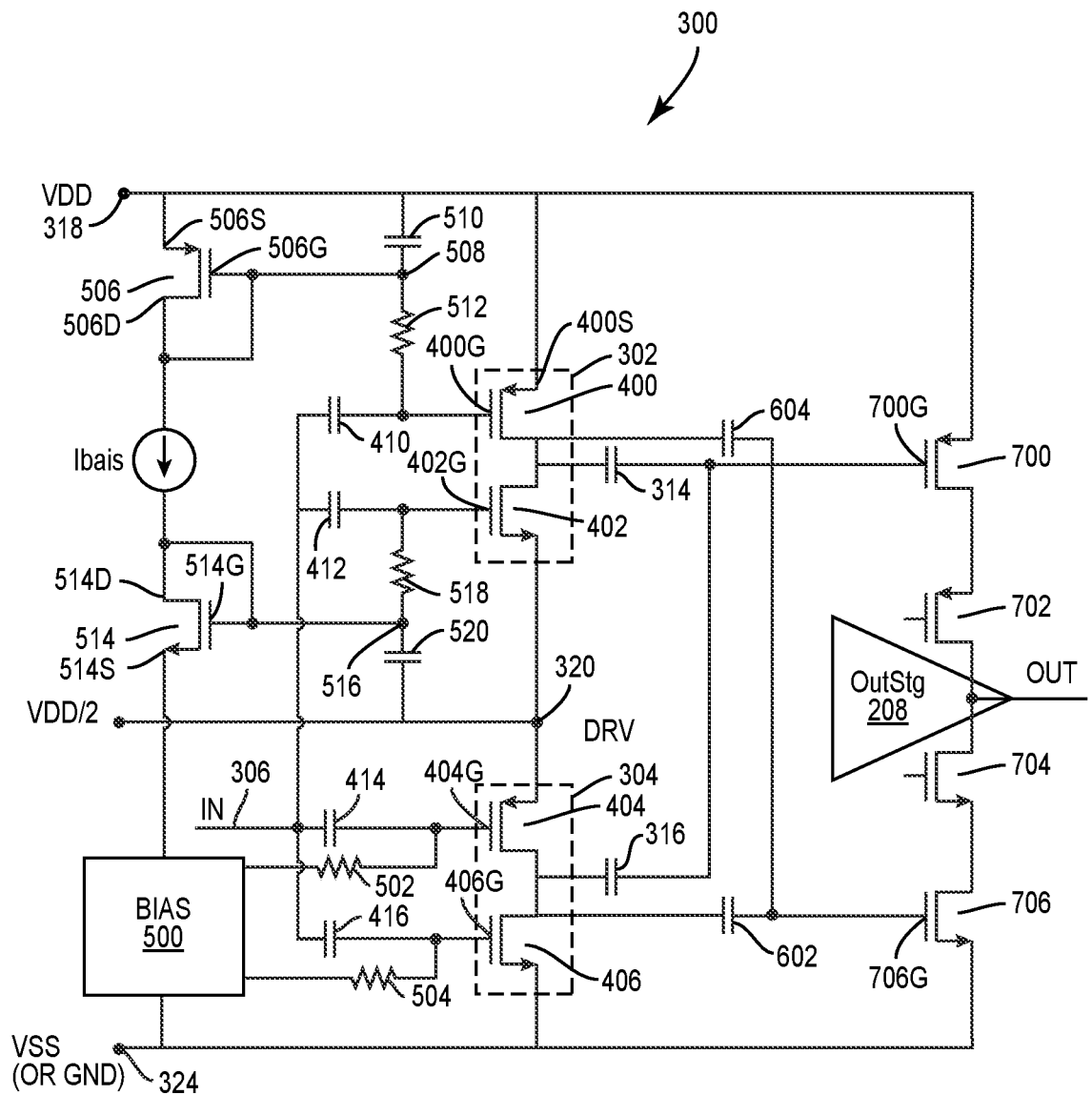
FIG. 7 is a circuit diagram of the two stacked amplifiers of FIG. 5 with an expanded view of the output amplifier stage.

By way of further illustration, the output amplifier stage 208D may also be stacked transconductance devices as illustrated in FIG. 7. Specifically, the output amplifier stage 208D may include FETs 700, 702, 704, 706 coupled at gates 700G, 706G to the driving amplifier stage 300 previously described. The FETs 700, 702 may be PFETs and the FETS 704, 706 may be NFETs. Collectively the FETs 700, 702, 704, 706 provide a stacked transconductance.

Figure 8:
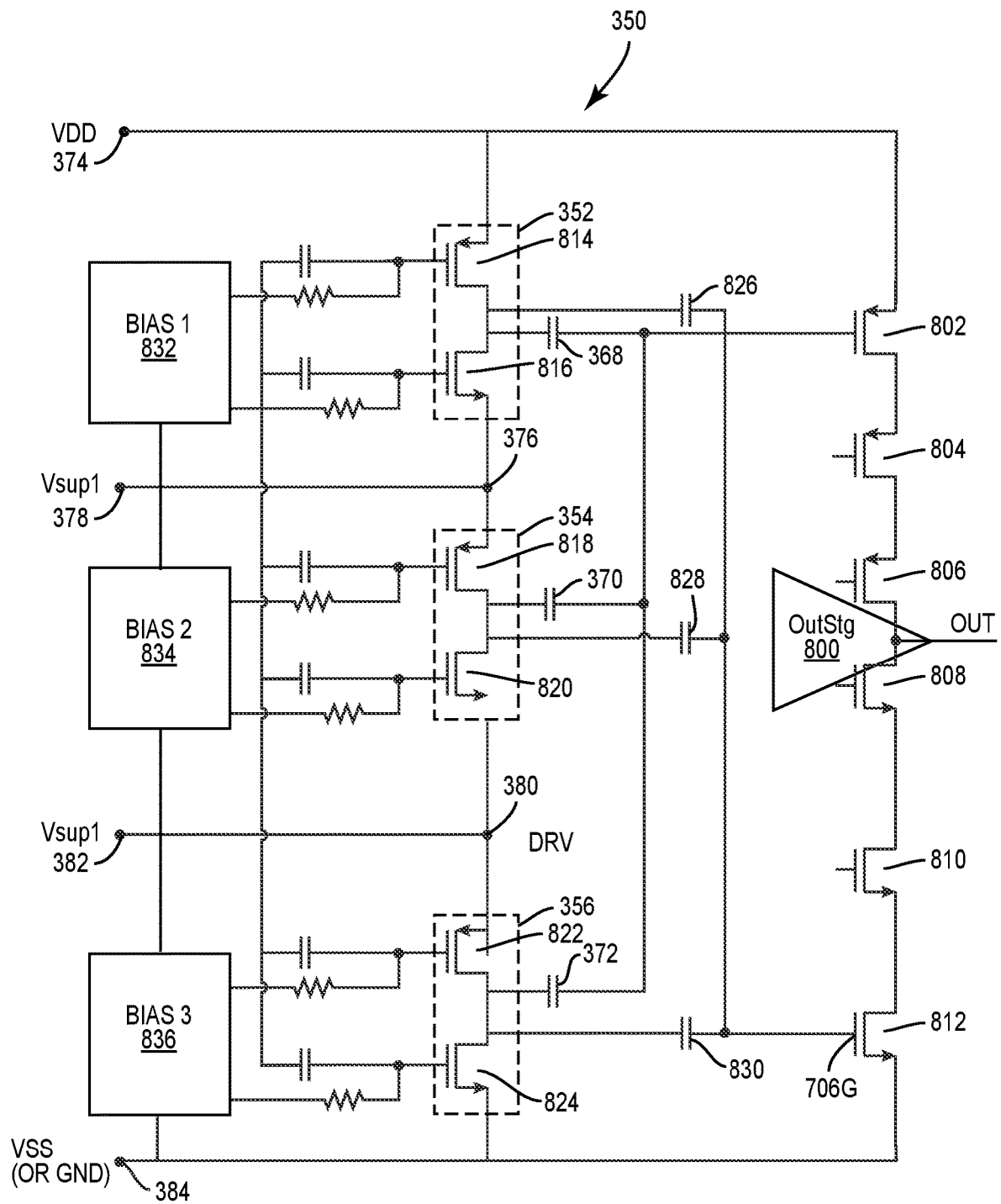
FIG. 8 is a circuit diagram of the three stacked amplifiers of FIG. 3B with additional detail about the biasing for the stacked transconductance devices.

While the above discussion has been primarily focused on the driving amplifier stage 300, FIG. 8 provides a similar expansion of the driving amplifier stage 350 coupled to an output amplifier stage 800. The output amplifier stage 800 may include stacked FETs 802, 804, 806, which may be PFETs and FETs 808, 810, 812, which may be NFETs.

The amplifier 352 may be a stacked PFET 814 and NFET 816. The amplifier 354 may be a stacked PFET 818 and NFET 820. The amplifier 356 may be a stacked PFET 822 and NFET 824. In addition to the capacitors 368, 370, 372, capacitors 826, 828, 830 may couple the amplifiers 352, 354, 356 to the output amplifier stage 800.

Bias circuits 832, 834, 836 may be used to provide bias to the amplifiers 352, 354, 356 through the capacitors and resistors noted similar to those described above in FIG. 5. Again, the three stacked amplifiers 352, 354, 356 reuse the same supply current and have the voltage swing reduced through the use of the intermediate supply voltages Vsup1, Vsup2.

Figure 9:
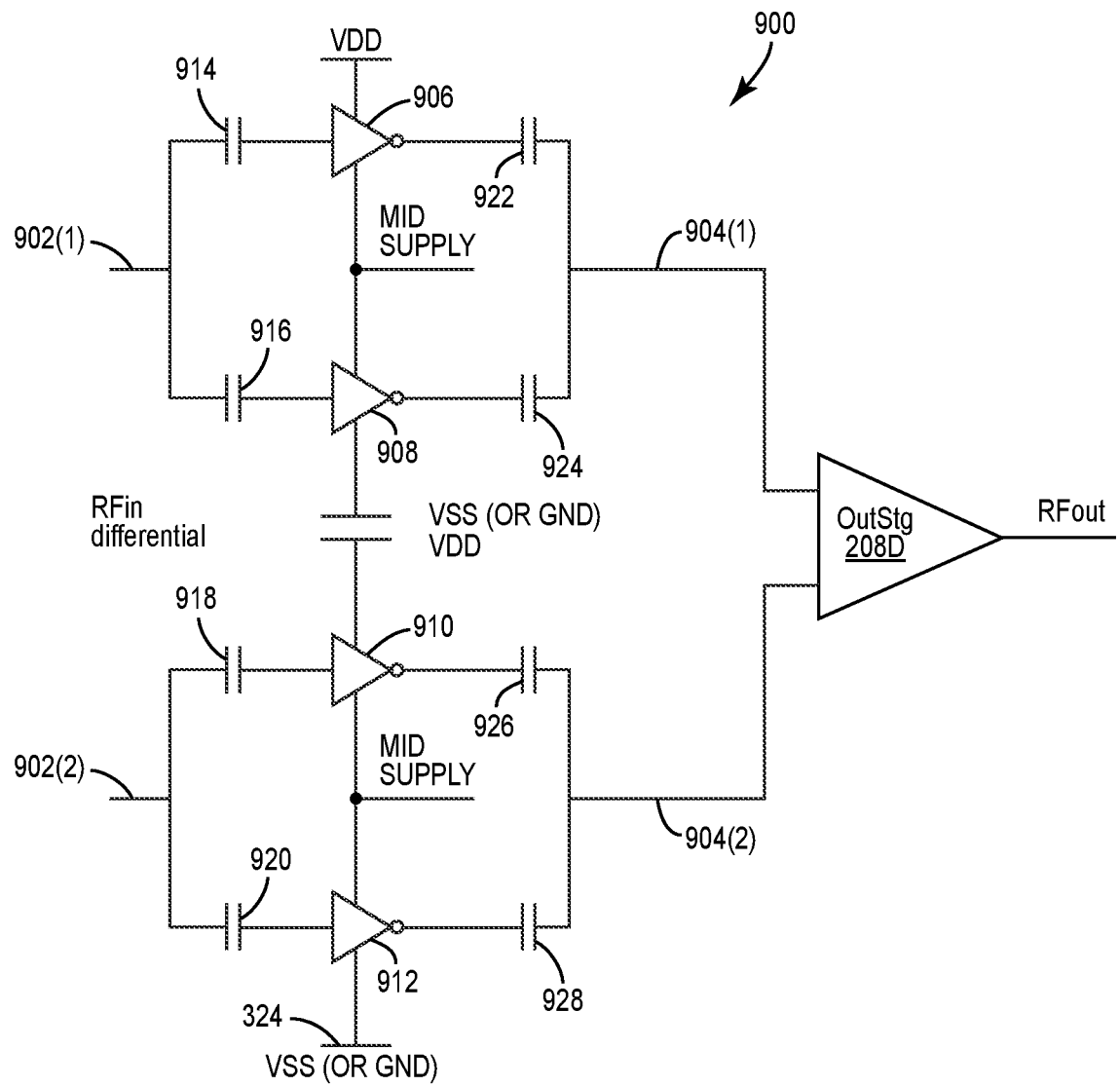
FIG. 9 is a mixed block-circuit diagram showing a differential-to-single-ended arrangement of stacked transconductance devices according to the present disclosure.

FIG. 9 provides an example of a completely differential driving amplifier stage 900 coupled to a differential-to-single-ended output amplifier stage 208D. The driving amplifier stage 900 includes differential inputs 902(1), 902(2) and differential outputs 904(1), 904(2). The input 902(1) and output 904(1) are associated with stacked transconductance devices, namely amplifiers 906, 908, which may be analogous to amplifiers 302, 304, respectively. Likewise, the input 902(2) and output 904(2) are associated with stacked transconductance devices 910, 912, which may be analogous to amplifiers 302, 304, respectively. AC coupling capacitors 914, 916, 918, 920, 922, 924, 926, 928 may be used as previously described.

Figure 10:
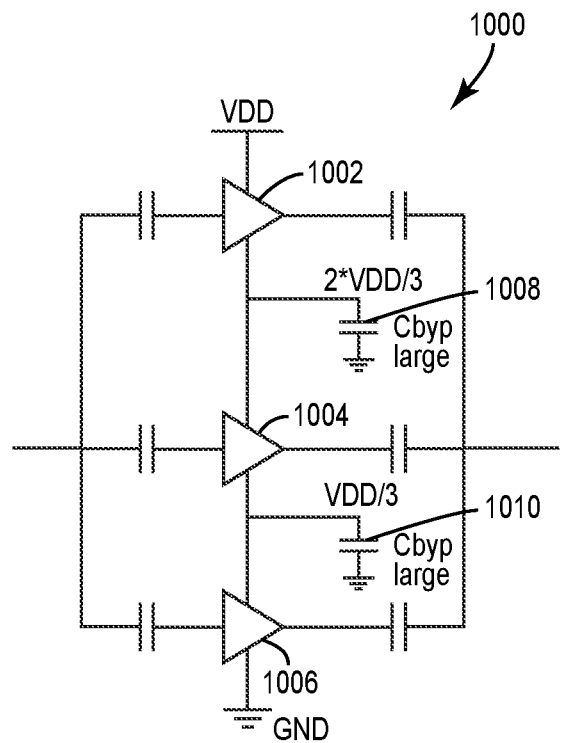
FIG. 10 is a circuit diagram of the three stacked amplifiers of FIG. 3B with a possible supply source expanded.

In the course of development, it was discovered that the capacitors used to support the mid voltage supplies (e.g., capacitor 420 of FIG. 4) are typically going to be fairly large. While a single such capacitor 420 may be an acceptable design compromise for two stacked amplifiers 302, 304, such approach may consume too much real estate when expanded to more than two stacked amplifiers. Thus, as illustrated by driving amplifier stage 1000 in FIG. 10 that has three stacked amplifiers 1002, 1004, 1006, two large capacitors 1008 and 1010 are used to supply mid voltages 2VDD/3 and VDD/3. The more stacked amplifiers present in a driving amplifier stage, the more real estate that is consumed.

Figure 11:
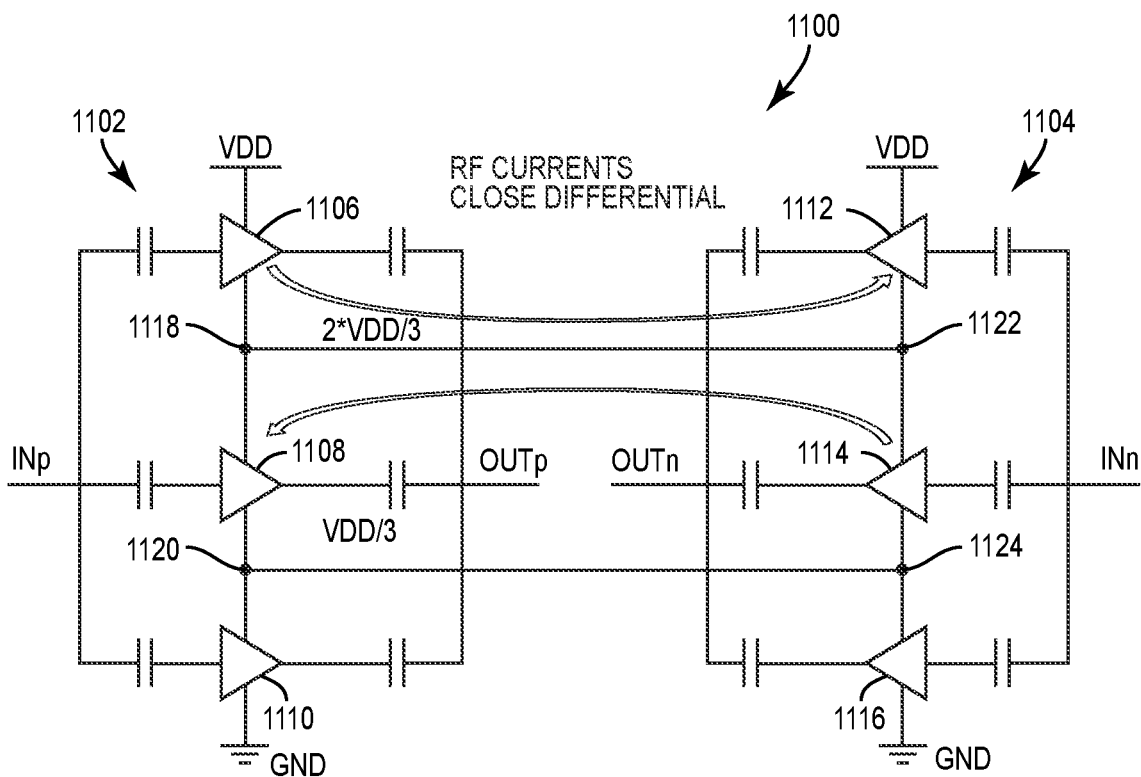
FIG. 11 is a circuit diagram of a differential version of the three stacked amplifiers of FIG. 3B with an alternate possible supply source expanded.
Figure 12:
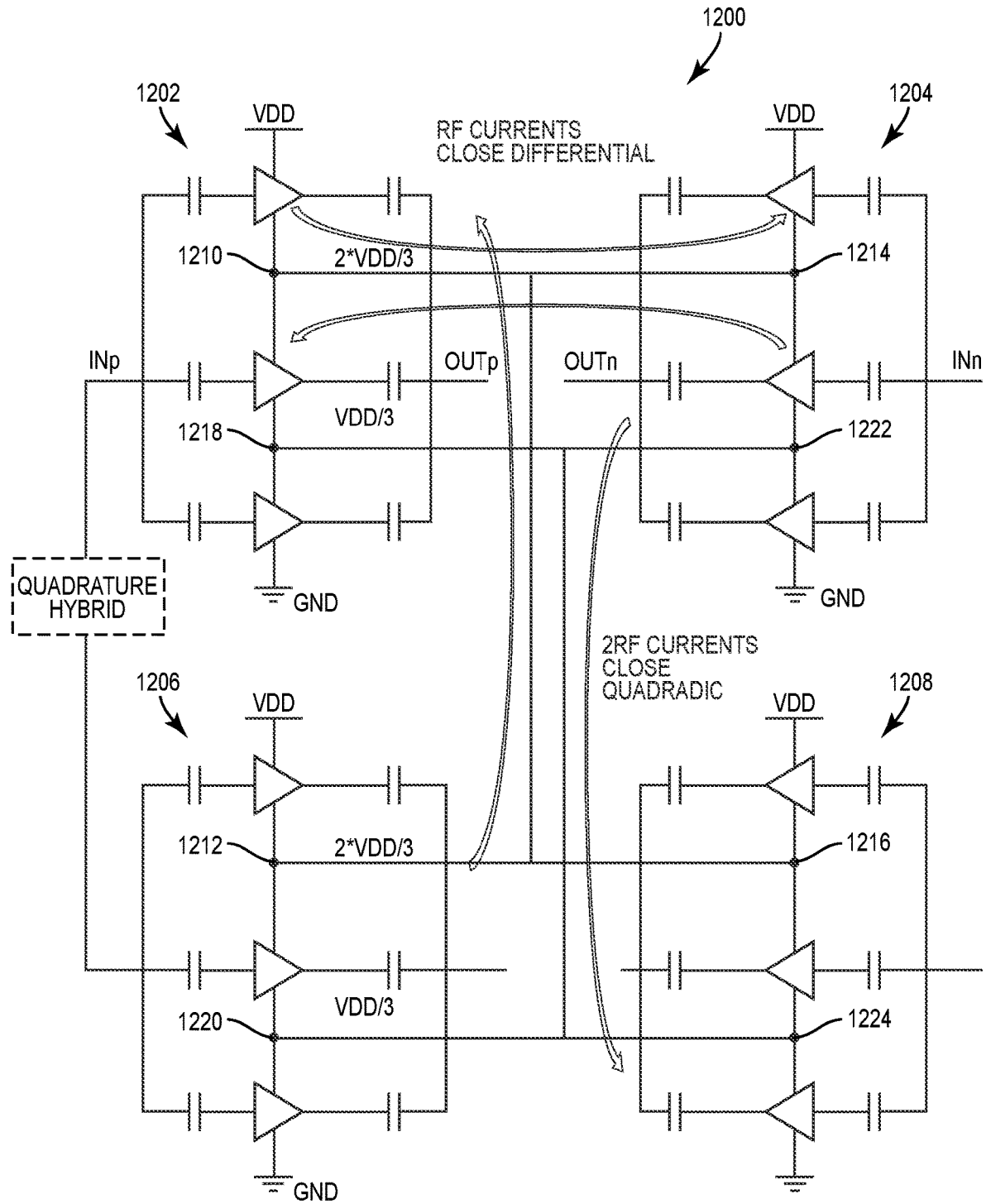
FIG. 12 is a circuit diagram of a quadrature version of the three stacked amplifiers of FIG. 3B with a power supply similar to that presented in FIG. 11.

Exemplary aspects of the present disclosure provide an alternate solution to the large capacitors 1008, 1010 that is well suited for use in differential or quadrature structures as shown in FIGS. 11 and 12. Specifically, a mirrored arrangement is provided which allows for current to be reused between branches of the mirrored arrangement.

In this regard, FIG. 11 illustrates a differential driving amplifier stage 1100 with a first stack 1102 and a second stack 1104. The first stack 1102 includes three stacked amplifiers 1106, 1108, 1110. The second stack 1104 includes three stacked amplifiers 1112, 1114, 1116. Node 1118 exists between amplifiers 1106 and 1108, and node 1120 exists between amplifiers 1108 and 1110. The nodes 1118 and 1120 correspond to the input nodes for the mid-level voltage supplies. Similarly, node 1122 exists between amplifiers 1112 and 1114, and node 1124 exists between amplifiers 1114 and 1116. The node 1118 is coupled to the node 1122, and the node 1120 is coupled to the node 1124. This arrangement allows current to be provided from the node 1122 to the node 1118 and vice versa depending on changes in the supply provided to the different stacks 1102, 1104. Likewise, current may be provided from the node 1124 to the node 1120 and vice versa. While there may be more devices in the driving amplifier stage 1100 compared to the driving amplifier stage 1000, the overall size may be reduced because of the elimination of the capacitors 1008, 1110.

A similar advantage is provided in a quadrature structure as shown by the driving amplifier stage 1200 illustrated in FIG. 12. The driving amplifier stage 1200 includes stacks 1202, 1204, 1206, 1208 which are coupled at nodes 1210, 1212, 1214, 1216 and also at nodes 1218, 1220, 1222, 1224. Again, current can flow between the nodes as needed to provide the appropriate supply voltage without the need for large bypass capacitors.

The driving amplifier stage with low output impedance according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

The previous description of the disclosure is provided to enable any person skilled in the art to make or use the disclosure. Various modifications to the disclosure will be readily apparent to those skilled in the art, and the generic principles defined herein may be applied to other variations.

Thus, the disclosure is not intended to be limited to the examples and designs described herein, but is to be accorded the widest scope consistent with the principles and novel features disclosed herein.

What is claimed is:

1. A driving amplifier stage comprising:
an input;
an output; and
an amplifier stack coupled to the input comprising:
a first amplifier coupled to the input and the output;
a second amplifier coupled to the input and coupled to the output such that a summed output signal is available at the output;
a voltage supply input; and
a mid-level voltage supply input node between the first amplifier and the second amplifier, wherein the mid-level voltage supply input node is configured to be held at a fraction of a voltage supply level to limit voltage swing across the first amplifier.

2. The driving amplifier stage of claim 1, wherein the first amplifier comprises a first p-type field effect transistor (FET) (PFET) and a first n-type FET (NFET) stacked under the first PFET, wherein the first PFET is coupled to the voltage supply input and the first NFET is coupled to the mid-level voltage supply input node.

3. The driving amplifier stage of claim 2, wherein the second amplifier comprises a second PFET and a second NFET stacked under the second PFET, wherein the second PFET is coupled to the mid-level voltage supply input node.

4. The driving amplifier stage of claim 1, wherein the mid-level voltage supply input node is coupled to a bypass capacitor.

5. The driving amplifier stage of claim 1, wherein the amplifier stack comprises a differential amplifier stack.

6. The driving amplifier stage of claim 5, wherein the mid-level voltage supply input node couples a first portion of the differential amplifier stack to a second portion of the differential amplifier stack.

7. The driving amplifier stage of claim 1, wherein the amplifier stack comprises a quadrature amplifier stack.

8. The driving amplifier stage of claim 7, wherein the mid-level voltage supply input node couples a first portion of the quadrature amplifier stack to a second portion, a third portion, and a fourth portion of the quadrature amplifier stack.

9. The driving amplifier stage of claim 1, further comprising a bias circuit coupled to the first amplifier.

10. The driving amplifier stage of claim 1, wherein the output comprises a differential output.

11. A driving amplifier stage comprising:
an input configured to receive a radio frequency (RF) input; and
an amplifier stack comprising:
a first amplifier comprising a complementary metal oxide semiconductor (CMOS) arrangement of a first n-type field effect transistor (FET) (NFET) and a first p-type FET (PFET);
a mid-level voltage supply input node coupled to the first amplifier and a second amplifier, wherein the mid-level voltage supply input node is configured to be held at a fraction of a voltage supply level to limit voltage swing across the first amplifier;
the second amplifier comprising a CMOS arrangement of a second NFET and a second PFET, the second PFET coupled to the mid-level voltage supply input node, wherein the first amplifier and the second amplifier share a current; and
an output configured to provide a summed output signal from the first amplifier and the second amplifier.

12. The driving amplifier stage of claim 11, wherein the amplifier stack further comprises a third amplifier and a second mid-level voltage supply input node, wherein the second amplifier and the third amplifier are coupled to the second mid-level voltage supply input node.

13. The driving amplifier stage of claim 11, further comprising a capacitor positioned serially between the input and the first amplifier.

14. The driving amplifier stage of claim 11, wherein the amplifier stack comprises a differential amplifier stack.

15. The driving amplifier stage of claim 14, wherein the mid-level voltage supply input node couples a first portion of the differential amplifier stack to a second portion of the differential amplifier stack.

16. The driving amplifier stage of claim 11, wherein the amplifier stack comprises a quadrature amplifier stack.

17. The driving amplifier stage of claim 16, wherein the mid-level voltage supply input node couples a first portion of the quadrature amplifier stack to a second portion, a third portion, and a fourth portion of the quadrature amplifier stack.

18. An amplifier system comprising:
a driving amplifier stage comprising:
an input configured to receive a radio frequency (RF) input; and
an amplifier stack comprising:
a first amplifier comprising a complementary metal oxide semiconductor (CMOS) arrangement of a first n-type field effect transistor (FET) (NFET) and a first p-type FET (PFET);
a mid-level voltage supply input node coupled to the first amplifier and a second amplifier, wherein the mid-level voltage supply input node is configured to be held at a fraction of a voltage supply level to limit voltage swing across the first amplifier;
the second amplifier comprising a CMOS arrangement of a second NFET and a second PFET, the second PFET coupled to the mid-level voltage supply input node, wherein the first amplifier and the second amplifier share a current; and
an output configured to provide a summed output signal from the first amplifier and the second amplifier; and
an output power amplifier stage coupled to the output.

19. The amplifier system of claim 18, further comprising an interstage impedance transformation network positioned between the driving amplifier stage and the output power amplifier stage, wherein the interstage impedance transformation network is configured to provide no greater than a 2:1 impedance transformation.

20. The amplifier system of claim 18, wherein the output power amplifier stage is directly coupled to the driving amplifier stage.

* * * * *

UNITED STATES PATENT AND TRADEMARK OFFICE
CERTIFICATE OF CORRECTION

Page 1 of 1

PATENT NO. : 12,160,210 B2
APPLICATION NO. : 17/588867
DATED : December 3, 2024
INVENTOR(S) : Baker Scott et al.

It is certified that error appears in the above-identified patent and that said Letters Patent is hereby corrected as shown below:

In the Specification

In Column 7, Lines 6 and 7, replace "voltage source 118" with --voltage source 318--.

Signed and Sealed this
Thirty-first Day of December, 2024

Derrick Brent
*Acting Director of the United States Patent and Trademark Office*